United States Patent [19]
Kartschoke et al.

[11] Patent Number: 5,572,150
[45] Date of Patent: Nov. 5, 1996

[54] LOW POWER PRE-DISCHARGED RATIO LOGIC

[75] Inventors: Paul D. Kartschoke, Williston; Norman J. Rohrer, Underhill, both of Vt.

[73] Assignee: International Business Machines Corporation, Armonk, N.Y.

[21] Appl. No.: 419,630

[22] Filed: Apr. 10, 1995

[51] Int. Cl.[6] .................................................. H03K 19/00
[52] U.S. Cl. .............................. 326/95; 326/98; 326/83; 326/108
[58] Field of Search ..................... 326/95, 98, 86, 326/83, 108, 114; 327/530, 539

[56] References Cited

U.S. PATENT DOCUMENTS

| | | |
|---|---|---|
| 3,911,289 | 10/1975 | Takemoto . |
| 4,042,838 | 8/1977 | Street et al. . |
| 4,386,284 | 5/1983 | Wacyk et al. . |
| 4,404,474 | 9/1983 | Dingwall . |
| 4,446,386 | 5/1984 | Kurafuji . |
| 4,647,797 | 3/1987 | Sanwo ........................................ 326/98 |
| 4,649,296 | 3/1987 | Shoji . |
| 4,651,029 | 3/1987 | Oritani . |
| 4,692,639 | 9/1987 | Jordan . |
| 4,788,457 | 11/1988 | Mashiko ................................... 326/108 |
| 4,843,261 | 6/1989 | Chappell .................................. 326/108 |
| 4,857,764 | 8/1989 | Young ....................................... 326/98 |
| 4,857,768 | 8/1989 | Griffith et al. . |
| 5,105,104 | 4/1992 | Eisele ........................................ 326/98 |
| 5,159,210 | 10/1992 | Eitrheim .................................... 326/98 |

*Primary Examiner*—Edward P. Westin
*Assistant Examiner*—Andrew Sanders
*Attorney, Agent, or Firm*—Calfee, Halter & Griswold

[57] ABSTRACT

A circuit and method are provided for reducing the DC power consumption of clocked ratioed digital logic circuits. The circuit includes switching circuitry designed to analyze the voltage transitions of a ratioed digital logic circuit and based on such transitions, control the DC current flow through the entire circuit. Through the regulation of DC current flow through a digital logic circuit, the present invention reduces the detrimental effects of hot-electron effects and electromigration concerns which cause digital circuitry to fail. The circuit and method are illustrated by way of a ratioed logic NOR function employing MOSFET technology.

23 Claims, 4 Drawing Sheets

LOW POWER PRE-DISCHARGED RATIO LOGIC

FIELD OF THE INVENTION

The present invention relates generally to digital logic and, more specifically, to a low power pre-discharged ratio logic circuit and method.

BACKGROUND OF THE INVENTION

Personal computer systems are well known in the art. Personal computer systems in general, and IBM Personal Computers in particular, have attained widespread use for providing computer power to many segments of today's modern society. Personal computers can typically be defined as a desktop, floor standing, or portable microcomputer that is comprised of a system unit having a single central processing unit (CPU) and associated volatile and non-volatile memory, including all RAM and BIOS ROM, a system monitor, a keyboard, one or more flexible diskette drives, a fixed disk storage drive (also known as a "hard drive"), a so-called "mouse" pointing device, and an optional printer. One of the distinguishing characteristics of these systems is the use of a motherboard or system planar to electrically connect these components together. These systems are designed primarily to give independent computing power to a single user and are inexpensively priced for purchase by individuals or small businesses. Examples of such personal computer systems are IBM's PERSONAL COMPUTER AT (IBM PC/AT), IBM's PERSONAL SYSTEM/1 (IBM PS/1), and IBM's PERSONAL SYSTEM/2 (IBM PS/2).

Personal computer systems are typically used to run software to perform such diverse activities as word processing, manipulation of data via spread-sheets, collection and relation of data in databases, displays of graphics, design of electrical or mechanical systems using system-design software, etc.

At the most fundamental level, a computer's digital logic is comprised of transistors. Individually, these transistors act as simple switches, i.e. allowing electrical current to flow when a transistor is in a first state and not allowing any current to flow when the transistor is in a second state. Collectively, these transistors, or switches, may be connected in certain combinations to construct logical functions such as AND, OR, NOR, NAND, etc. They may also be combined on a more complex level to construct memory registers, flip-flops, programmable logic arrays (PLA's) and microprocessors. All these circuits are sometimes referred to as employing "transistor logic."

Of the many areas in which transistor logic is important, microprocessor development remains in the forefront. This is because a typical microprocessor includes millions of transistors in its digital circuitry. High end microprocessors, such as the Intel PENTUIM® or the POWER PC, are illustrative.

On a macroscopic level, these transistors perform all of a microprocessor's functions through digital logic circuits. On a microscopic level though, these transistors implement simple logical functions (OR, AND, NOR, etc) through well-known circuit configurations.

Since circuit speed (i.e. signal propagation through a circuit) is a very important consideration in circuit design, CMOS (Complementary Metal Oxide Semiconductor) technology has been traditionally employed to implement these logic functions because of its excellent switching characteristics and high reliability.

However, when a logic function, such as a NOR, requires a large number of inputs, implementation of the logic function through traditional CMOS technology has proven disadvantageous because the large number of inputs required tends to decrease the circuit's speed. To combat this disadvantage, designers have employed ratioed logic or pseudo-NMOS logic (N-channel Metal Oxide Semiconductor).

Illustrative of a ratioed logic circuit is a pre-discharged ratioed logic NOR gate. In a pre-discharged ratioed logic NOR gate, a single P-channel Field Effect Transistor (hereinafter PFET) is connected to the output of the gate along with an N-channel Field Effect Transistor (hereinafter NFET) for every input tied in parallel to ground. A ratioed logic circuit implies that PFET's and NFET's are contesting each other on a particular node when any one or more of the NFET's are "on." The particular node then produces a down level, called a "weak zero" because it is not at exactly ground voltage. This "weak zero," however, still can be interpreted by any logic circuit that follows, e.g. an inverter gate, as a ground level signal. The term "pre-discharged" generally refers to a method in which the output of a logic circuit is charged to ground potential (i.e. 0 volts) during a clock or RESET cycle. Conversely, other digital logic circuits may employ a procedure called "pre-charging" in which the output of logic circuit is charged to a certain voltage potential other than ground during a clock or RESET cycle. A detailed description of a typical pre-discharged ratioed logic circuit will be described hereinafter. To those skilled in the art, it will be apparent that similar circuits can be created using pseudo-PMOS logic (P-channel Metal Oxide Semiconductor). These pseudo-NMOS and pseudo-PMOS logic circuits are all collectively referred to as ratioed logic circuits because they all contain a particular output node which is in effect, ratioed in voltage between a PFET and a competing NFET.

As will become evident, ratioed logic circuits have several advantages as well as disadvantages. The advantages include their fast evaluation speed and compact physical layout characteristics, two very important characteristics for high density, high speed semiconductor products such as microprocessors, memory's, and PLA's. The major disadvantage, however, is that ratioed logic circuits consume large amounts of DC power due to the node contesting of PFET's and NFET's.

The consumption of large amounts of DC power is not only undesirable because it wastes power, but it also contributes to electromigration and hot-electron effects. The term electromigration (EM) refers to the transport of mass in metals when stressed to high current densities. EM occurs during the passage of direct current (DC) through thin metal conductors in integrated semiconductor circuits, and results in accumulation of metal in some regions and voids in other regions. EM in extreme cases may result in failed circuit performance if either (i) accumulations become so severe as to bridge adjacent conductors, thereby causing short circuits, or (ii) voids become so severe as to cause open circuits. Such occasions are referred to as catastrophic faults.

The term hot-electron (HE) effect refers to the phenomenon of electrons which originate from FET surface channel currents, from impact ionization currents at the FET drain junction, or from substrate leakage currents. Electrons drifting from the gate may gain sufficient energy to enter into the gate, or they may collide with the silicon atoms and generate electron-hole pairs. The hole adds to substrate current, and the secondary electron may be injected into the gate of a subsequent FET (see e.g., M. Annaratone, H.B. *Digital CMOS Circuit Design,* Kluwer Academic Publishers, Norwell Mass., p. 39, (1986)). As these secondary electrons accumulate in the gate, the FET threshold voltage shifts and the internal resistance of the device changes. These changes cause the FET to degrade and ultimately fail over time.

SUMMARY OF THE INVENTION

According to the present invention, a circuit and method for producing low power pre-discharged ratio logic is disclosed which substantially reduces DC power consumption and reduces electromigration and hot-electron effects while maintaining physical layout characteristics of digital circuits. The circuit includes switching circuitry and digital logic circuitry. The switching circuitry is in circuit communication with the digital logic circuitry.

The switching circuitry includes a control circuit for changing the switching circuitry between a first state and a second state. The states include a "reset" state and an "evaluation" state. The switching circuitry further includes a sensing circuit for sensing digital logic circuit input signal conditions. Such input signal conditions include input states to OR gates, NOR gates, NAND gates, etc. The switching circuitry also includes an output circuit for regulating the digital logic circuitry's generation of output signals. The output circuit controls the DC power consumption by the digital logic circuitry. The control circuit is in circuit communication with the sensing circuit and the sensing circuit is in circuit communication with the output circuit.

The switching circuitry is designed to sense and respond to transitions of a pre-discharged ratioed logic node and based on such transitions, regulate the current flow in the entire circuit. The switching circuitry senses the voltage at a particular node through the sensing circuit and determines whether the output circuit should maintain a particular voltage level at the analyzed node. This determination is a function of a plurality of digital signals associated with the digital logic circuit. These digital signals include logic function input signals, logic function output signals, clock signals, and reset signals. If a determination is made that the voltage level should be changed, the switching circuitry changes from a first state to a second state. This change in the switching circuitry states regulates the DC current flow in the digital circuit as a whole.

In a digital circuit which executes logic functions, (the digital circuit including an input, output and a control circuit and digital signals associated therewith) the present invention provides a method for reducing the DC power consumption of the digital circuit. In particular, DC power consumption is reduced by sensing voltage level transitions at a particular node in the digital circuit through the sensing circuit and determining an appropriate voltage level for the output circuit by changing a switching circuit from a first state to a second state. The switching circuit's state transitions are a function of the voltage level transitions. Power consumption of the digital logic circuit is controlled by regulating the DC current in response to the state of the switching circuit. The sensing voltage level transitions includes the sensing of one or more digital signals including logic function input signals, logic function output signals, clock signals and reset signals. In effect, the present invention transforms a ratioed logic circuit into a low power logic circuit by removing the "ratioed" effect of PFET's competing with NFET's.

The illustrated embodiment of a NOR logic function employs PFET's and NFET's in the form of MOS (Metal Oxide Semiconductor) technology. Any digital logic circuit in general, and microprocessors in particular, can be implemented through the present invention. Furthermore, traditional ratioed logic circuits may be converted to low power logic circuits without disturbing the ratioed logic circuit physical layout characteristics.

It is therefore an object of the present invention to provide a circuit and method for eliminating DC power consumption in ratioed logic digital circuits.

It is a further object of this invention to provide an increase in the speed and reliability of digital logic circuits by reducing DC power consumption in clocked ratioed logic digital circuits.

These and other objects of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to example the principles of this invention.

DETAILED DESCRIPTION OF THE PREFERRED EMBODIMENT

Figure 1:
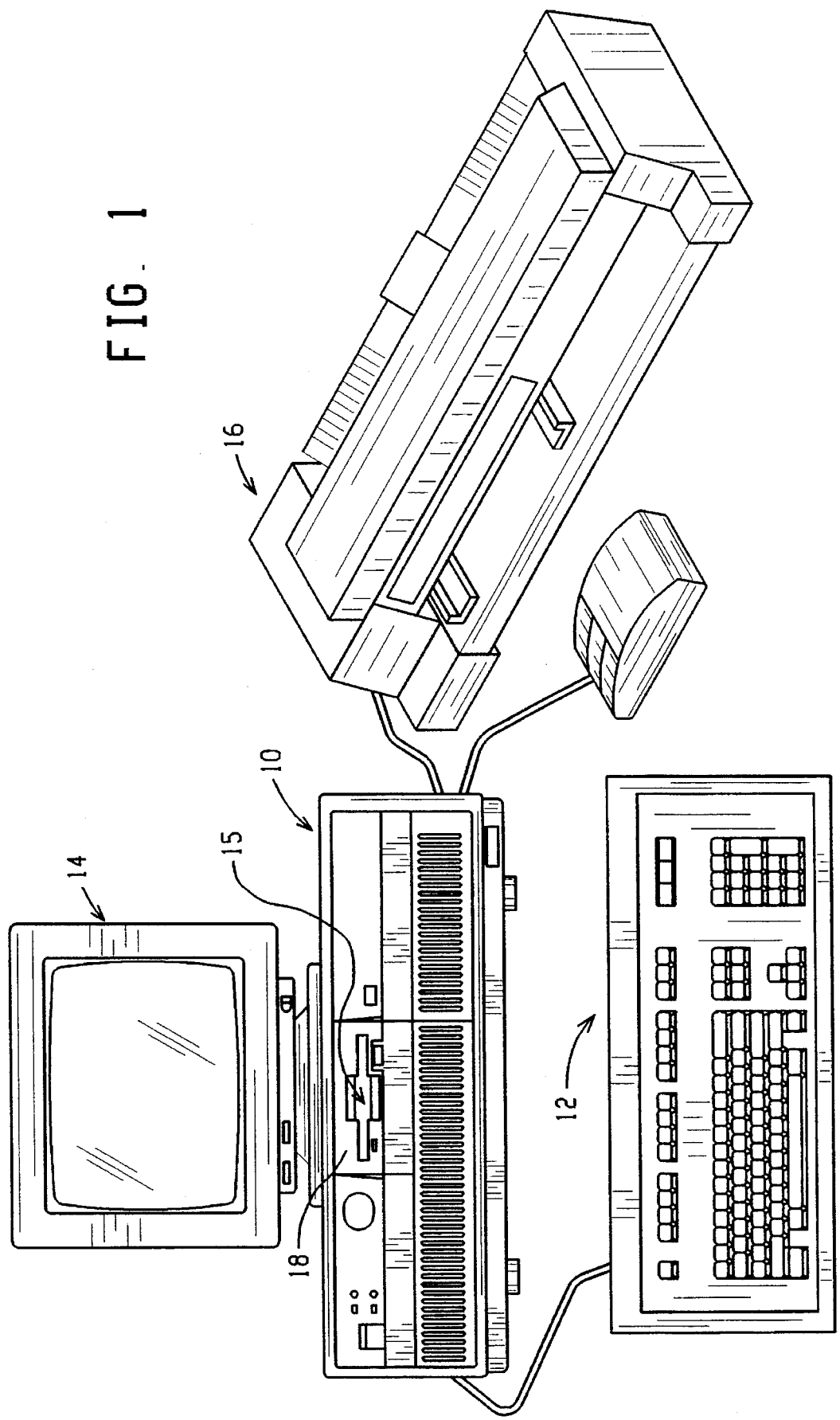
FIG. 1 is a perspective view of a personal computer incorporating the low power pre-discharged ratioed logic of the present invention.

Before describing the details of the present invention, a description of a generic computer's composition and operation may be helpful in understanding the advantages of the low power pre-discharged ratioed logic of the present invention. Reference is had, therefore, to FIG. 1, which shows a microcomputer embodying the low power pre-discharged ratioed logic of the present invention generally at 10. As mentioned hereinabove, the computer 10 may have an associated monitor 14, keyboard 12, mouse 15 and printer or plotter 16.

Figure 2:
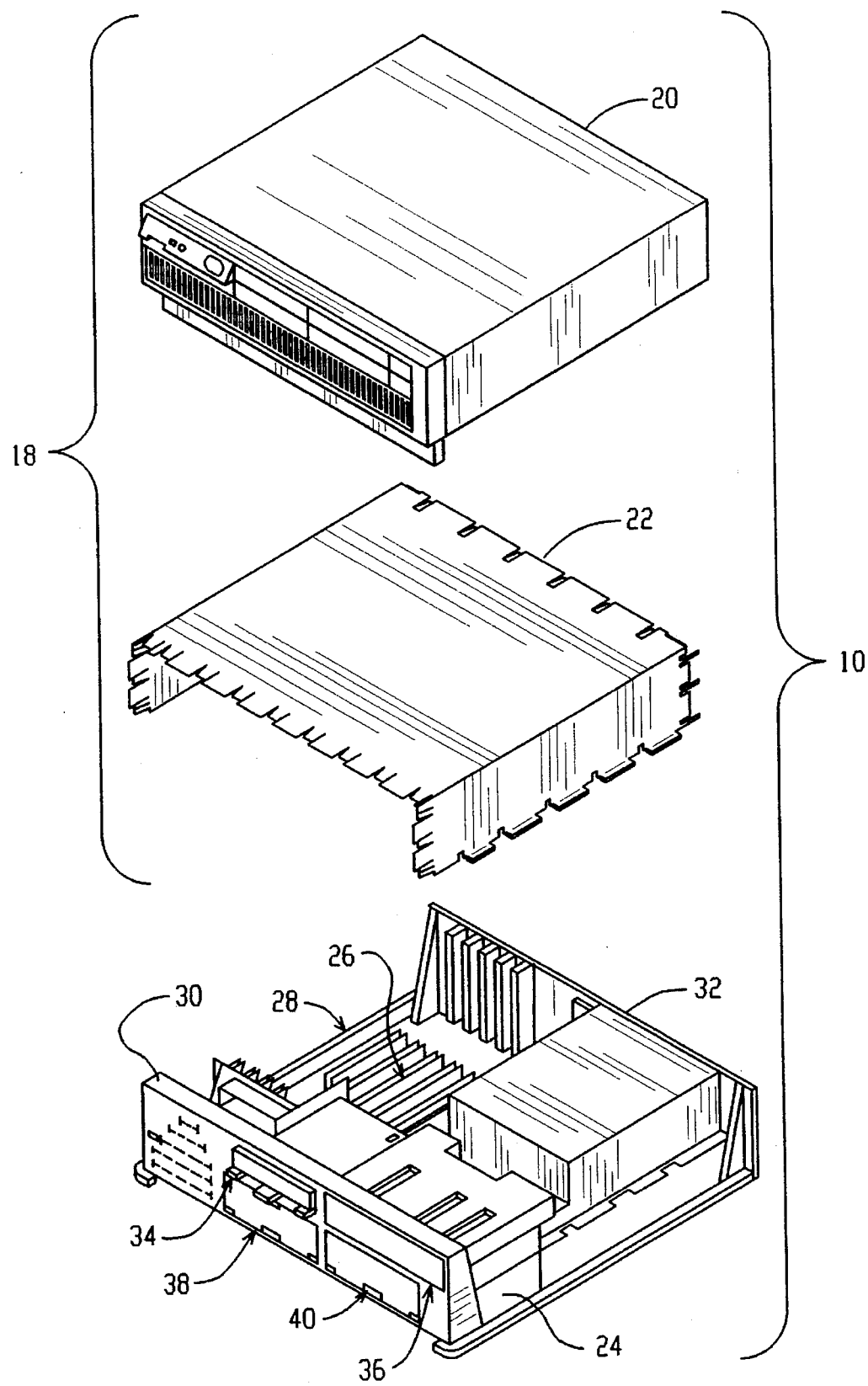
FIG. 2 is an exploded perspective view of certain elements of the personal computer of FIG. 1 including a chassis, a cover, an electromechanical direct access storage device and a planar board, illustrating certain relationships among those elements.

Referring now to FIG. 2, the computer 10 has a cover 18 formed by a decorative outer member 20 and an inner shield member 22 which cooperate with a chassis 28 in defining an enclosed, shielded volume for receiving electrically powered data processing and storage components for processing and storing digital data. At least certain of these components are mounted on a multi-layer planar board 26 or mother board which is mounted on the chassis 28 and provides a structure for electrically interconnecting the components of the computer 10 including those identified above and such other associated elements as floppy disk drives, various forms of direct access storage devices, accessory cards or boards, and the like. As pointed out more fully hereinafter, provisions are made in the planar board 26 for the passage of input/output signals to and from the operating components of the microcomputer.

Still referring to FIG. 2, the chassis 28 has a base indicated at 24, a front panel indicated at 30, and a rear panel indicated at 32. The front panel 30 defines at least one open bay (and in the form illustrated, four bays) for receiving a data storage device such as a disk drive for magnetic or optical disks, a tape backup drive, or the like. In the illustrated form, a pair of upper bays 34, 36 and a pair of lower bays 38, 40 are provided. One of the upper bays 34 is adapted to receive peripheral drives of a first size (such as those known as 3.5 inch drives) while the other bay 36 is adapted to receive drives of a selected one of two sizes (such as 3.5 and 5.25 inch) and the lower bays are adapted to receive devices of only one size (3.5 inch). One floppy disk drive is indicated at 15 in FIG. 1, and is a removable media direct access storage device capable of receiving a diskette inserted thereinto and using the diskette to receive, store and deliver data as is generally known. Furthermore, bays 34–40 may also receive CD-ROM drives (not shown) for additional information retrieval and storage and also for multimedia capabilities.

Figure 3:
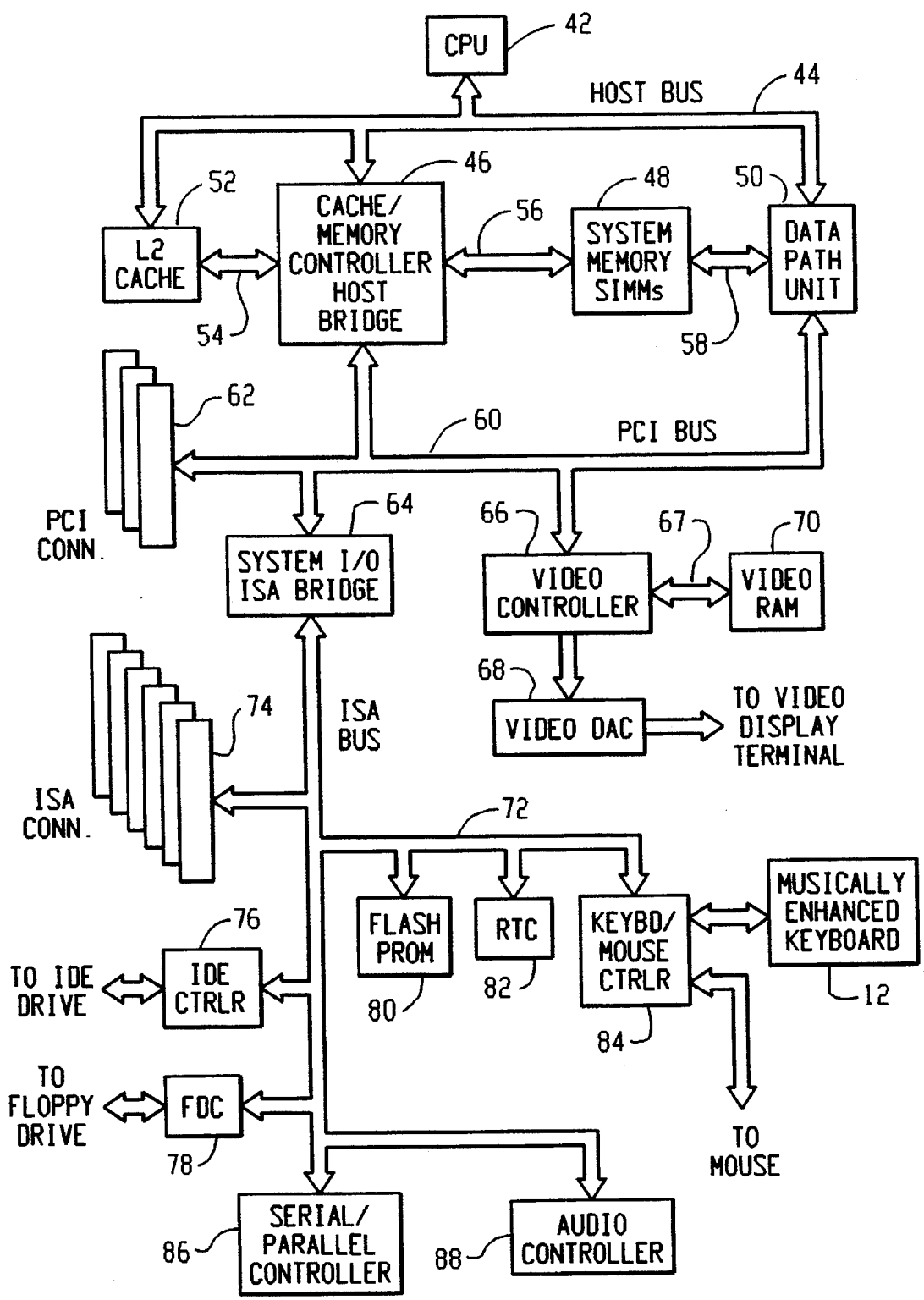
FIG. 3 is a schematic view of certain components of the personal computer of FIGS. 1 and 2 incorporating the low power pre-discharged ratioed logic of the present invention.

Prior to relating the above structure to the present invention, a summary of the general operation of the personal computer system 10 merits review. Referring to FIG. 3, there is shown a block diagram of a personal computer system illustrating the various components of the computer system 10 in accordance with the present invention, including components mounted on the planar 26 (shown in FIG. 2) and the connection of the planar to the I/O slots and other hardware of the personal computer system. Connected to the planar board 26 (shown in FIG. 2) is the system processor 42. While any appropriate microprocessor can be used as the CPU 42, suitable microprocessors include the Intel PENTUIM® and the IBM POWER PC. The CPU 42 is connected by a high speed CPU host bus 44 to a cache/memory controller and host bridge 46, data path unit 50, and second level cache memory (L2 cache) 52.

The cache/memory controller and host bridge 46 is connected to L2 cache 52 via a bus 54 and to a system memory 48 via a bus 56. The cache/memory controller and host bridge 46 integrates the L2 cache 52 and system memory 48 control functions and provides address paths and bus controls for transfers between the Host (CPU 42), system memory 48, and a Peripheral Component Interconnect (PCI) bus 60. The PCI bus 60 employs a 32 bit data bus that supports multiple peripheral components and add-in cards at a peak bandwidth of 132 MB/second.

During bus operations between the Host (CPU 42), system memory 48 and PCI bus 60, the cache/memory controller 46 provides the address paths and bus controls. The cache/memory controller 46 also controls data flow through the data path unit 50.

The data path unit 50 provides data path connections between the Host (CPU 42), system memory 48, and PCI bus 60. The system memory 48 is interfaced to the data path unit 50 via a data bus 58 whereby data is transmitted into and out of the system memory 48. The cache/memory controller 46 and the data path unit 50 provide a full function data path connection to system memory 48 and from PCI bus 60 to a Host subsystem (such as CPU 42).

The PCI bus 60 is further connected to a plurality of PCI bus expansion slots 62 (three slots are shown), system I/O bridge controller 64, and video controller 66. The system I/O bridge controller 64 provides a bridge between the PCI bus 60 and an ISA bus 72 (or an EISA bus; not shown) and integrates many of the common I/O functions found in todays ISA (or EISA) based PC systems. The video controller 66, which is associated with a video RAM 70 for storing graphic information via a bus 67, is interfaced to the PCI Bus 60 to allow large amounts of data required for high performance graphics to be transmitted quickly to the video controller 66. Video signals generated by video controller 66 may be passed through a Digital to Analog Converter (DAC) 68 to a video display terminal or other display device.

Various peripheral devices are typically connected to the ISA bus 73, such as ISA expansion slots 74 (6 are shown), IDE hard disk controller 76, floppy disk controller (FDC) 78, flash PROM (BIOS) 80, real time clock 82, keyboard/mouse controller 84, serial/parallel controller 86, and optionally, Audio controller 88.

While the above description has been described with some particularity, it is to be understood that the present invention may be used in conjunction with other hardware configurations. For example, other peripheral components such an Ethernet controller, multimedia controller, or Small Computer System Interface II (SCSI II) controller may be added to PCI bus 60.

Figure 4:
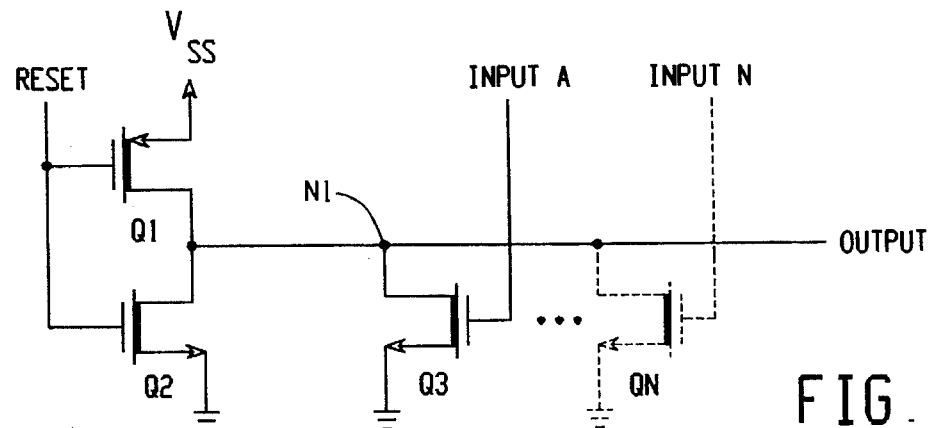
FIG. 4 is schematic illustration of a typical ratioed logic circuit implementing a NOR function.

Referring now to FIG. 4, a schematic illustration of a typical ratioed logic circuit implementing a NOR function is shown. The circuit is comprised of NFET's Q2 and Q3 and PFET Q1. PFET Q1 and NFET Q2 are connected to each other in a configuration commonly known as a complementary follower.

In particular, PFET Q1 is connected to voltage Vss (normally +3 to +5 Volts DC) through its source terminal and through its drain terminal, PFET Q1 is connected to NFET Q2's drain terminal. PFET Q1's gate terminal is connected to a RESET or clock input. NFET Q2, as previously mentioned, has its drain terminal connected to PFET Q1's drain terminal and its source terminal connected to ground (i.e. zero volts). NFET Q2's gate terminal is connected to the same RESET or clock input as PFET Q1's base terminal. To form a single input NOR function, the drain terminals of PFET Q1 and NFET Q2 are connected to the drain terminal of NFET Q3 at node N1. The source terminal of NFET Q3 is connected to ground and the gate terminal is connected to INPUT A. As will be shortly described, Node N1 forms the output of the NOR function and INPUT A forms one input of the NOR function. Furthermore, as is well known in the art, an multi-input NOR function with "N" inputs may be implemented by connecting the drain terminals of "N" number NFET transistors to node N1 with their source terminals connected to ground, as illustrated by NFET QN.

Fundamental to the understanding of the present invention is a transistor's ability to act as a switch and a brief review of a FET's switching characteristics is warranted. In particular, a PFET will form a closed circuit between its source and drain terminals when voltage Vgs is less than voltage Vt, where Vgs is the gate to source potential and Vt is the threshold voltage. When Vgs is greater than Vt, the PFET forms an open circuit between its source and drain. Conversely, an NFET will form a closed circuit between its drain and source terminals when Vgs is greater than Vt. Hereinafter, the term "ON" will refer to a FET in the closed circuit condition and the term "OFF" will refer to a FET in the open circuit condition.

Referring now to FIG. 4, the operating characteristics of a ratioed logic NOR gate will be presently described. In particular, it will be shown that a ratioed logic digital circuit suffers from the disadvantage of dissipating DC power, while in a certain logic state, due to the competing effects of PFET's and NFET's at a particular output node. FIG. 4 Circuit Operation: Condition-RESET is HI and INPUT A is a "don't care":

When RESET signal is applied (typically +3 to +5 VDC), node N1 is pulled to ground because NFET Q2 is ON and provides a direct DC current path to ground. PFET Q1 is OFF. The output at node N1 will be ground and INPUT A essentially becomes a "don't care" condition since the output of the NOR function will always be ground when RESET is applied (See Table I; X="don't care"; LOW=0 and HI=1).

FIG. 4 Circuit Operation: Condition—RESET is LOW and INPUT A is LOW:

When RESET is LOW, NFET Q2 turns OFF and PFET Q1 turns ON to drive node N1 HI to voltage Vss. Since INPUT A to NFET Q3 is LOW, NFET Q3 will OFF and node N1 will remain HI.

FIG. 4 Circuit Operation: Condition—RESET is LOW and INPUT is HI:

When RESET is LOW, NFET Q2 turns OFF and PFET Q1 turns ON to drive node N1 HI to Vss. However, since INPUT A to NFET Q3 is HI, NFET Q3 will turn ON. NFET Q3 is attempting to drive node N1 to ground while PFET Q1 is attempting to drive node N1 to Vss. The result is that node N1 will not be at exactly ground, but is instead at what is called a "weak zero," i.e. 300 mv to 500 mv. A "weak zero" is still interpreted by other logic circuits connected to the output, that is node N1, as a LOW output and thus the NOR function is still preserved (See Table I). Essentially, PFET Q1 and NFET Q3 must be ratioed so that node N1 will produce a "weak zero." When PFET Q1 and NFET Q3 are both on, a voltage divider circuit is formed with its output at node N1 based on PFET Q1 and NFET Q3's physical characteristics.

Under this condition (i.e. RESET signal is LOW and INPUT A is HI), however, DC current and thus power is being consumed by the NOR circuit. In particular, this condition arises because PFET Q1 is ON and NFET Q3 is ON. PFET Q1 is attempting to drive node N1 to voltage Vss and NFET Q3 is attempting to drive node N1 to ground voltage. This causes a current path to exist from Vss through PFET Q1 and NFET Q3 to ground. When current flows through PFET Q1 and NFET Q3 power is dissipated in these FET's due to their inherent internal resistances. This power dissipation tends to degrade the FETs due to hot-electron effects and electromigration concerns, as previously mentioned. Furthermore, the above example is illustrated with a single input NOR gate. The amount of DC current and therefore power dissipated by a multiple "N" input NOR gate would be greater. The immediate function of the present invention is to eliminate DC power consumption in such circumstances.

TABLE I

Clocked Ratioed Single Input NOR Function

| RESET | INPUT A | OUTPUT |
| --- | --- | --- |
| 0 | 0 | 1 |
| 0 | 1 | "weak" 0 |
| 1 | X | 0 |

Under the present invention, virtually every component of the personal computer 10 (shown in FIGS. 1–3) which utilizes clocked ratioed digital logic can be implemented through the low power pre-discharged ratioed logic disclosed herein. The CPU 42, which employs millions of transistors to implement its digital logic, is one particular component which can benefit from the use of the low power pre-discharged ratioed logic of the present invention. Others devices include, but are not limited to, Programmable Logic Arrays (PLA's) and other digital controllers.

Figure 5:
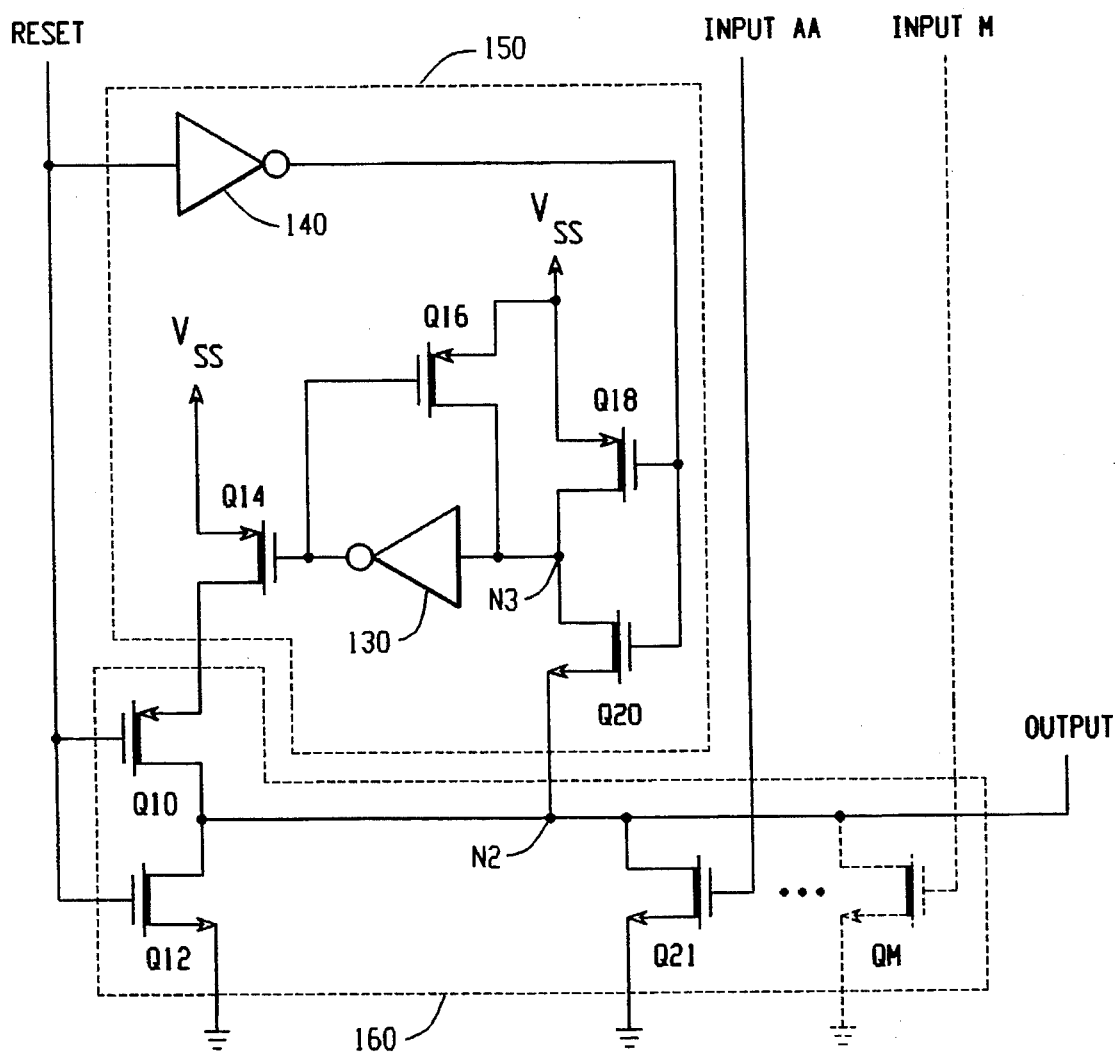
FIG. 5 is a schematic illustration of a low power pre-discharged ratioed logic circuit of the present invention implementing the same NOR function of FIG. 4.

Referring now to FIG. 5, a low power pre-discharged ratioed logic circuit of the present invention implementing the same NOR function of FIG. 4 is illustrated. The circuit is comprised of NFET's Q12, Q20, and Q21 and PFET's Q10, Q14, Q16, and Q18, and Inverter gates 130 and 140. PFET Q10 and NFET's Q12 and Q21 form the NOR function digital circuitry 160. PFET's Q14, Q16 and Q18, and NFET Q20 and inverter gates 130 and 140 form switching circuit 150. As was described earlier, a multiple input, i.e. "M" inputs, NOR function may be also be implemented as shown by NFET QM.

In particular, the digital circuitry 160 includes PFET Q10 and NFET Q12 which are connected to each other in a configuration commonly known as a complementary follower. The source terminal PFET Q10 is connected to the drain terminal of PFET Q14. The drain terminal of PFET Q10 is connected to NFET Q12's drain terminal. PFET Q10's gate terminal is connected to a RESET or clock input. NFET Q12 has its drain terminal connected to PFET Q10's drain terminal and its source terminal connected to ground (i.e. zero volts). NFET Q12's base terminal is connected to the same RESET or clock input as PFET Q10's base terminal. As was previously described, a single input NOR function is formed when the drain terminals of PFET Q10 and NFET Q12 are connected to the drain terminal of NFET Q21 at node N2. The source terminal of NFET Q21 is connected to ground and the gate terminal is connected to INPUT AA. Node N2 forms the output of the NOR function and INPUT AA forms the input of the NOR function. Furthermore, as is well known in the art, an N input NOR function may be implemented by connecting the drain terminals of N number NFET transistors to node N2 with their source terminals connected to ground, as was done with NFET Q21. This is essentially the same NOR function of FIG. 4, except that PFET Q10's source terminal is no longer connected to voltage VSS but to the drain terminal of PFET Q14.

The switching circuit 150 includes inverter gate 140, with its input connected to RESET and its output connected to the gate terminals of PFET Q18 and NFET Q20. PFET Q18 and NFET Q20 form a sensing circuit arrangement. In particular, the source terminal PFET Q18 is connected to voltage Vss. The drain terminal of PFET Q18 is connected to NFET Q20's drain terminal. NFET Q20 has its source terminal connected to node N2 (i.e the output of the logic circuit). By having its source terminal connected to node N2, NFET Q20 with PFET Q18 define a sensing circuit for the switching circuit.

The input of inverter gate 130 is connected to the common drains of PFET Q18 and NFET Q20. The output of inverter gate 130 is connected to the gate terminal of PFET Q14. PFET Q16 is connected to inverter gate 130 to form a latching circuit. In particular, the drain of PFET Q16 is connected to the input of inverter gate 130 and the source is connected to voltage Vss. The gate terminal of PFET Q16 is connected to the output of inverter gate 130. The latching characteristics of such a configuration will be described presently. Completing the circuit connection is PFET Q14, which has its source terminal connected to Vss and its drain terminal connected to source terminal of PFET Q10. The operating characteristics of the present invention are described hereinafter and in particular, the present invention's ability to substantially reduce and in some circumstances eliminate DC power consumption in digital logic circuits.

FIG. 5 Circuit Operation: Condition—RESET is HI and INPUT AA is a "don't care":

When RESET is applied, NFET Q12 comes ON (PFET Q10 is OFF) and node N2 is pulled to ground. Also, the output of inverter gate 140 goes LOW. Because the output of inverter gate 140 is LOW, PFET Q18 comes ON (NFET Q20 is OFF) and node N3 is pulled to Vss. In this manner, a control circuit is defined by the inverter gate 140 to control the state of the switching circuit. The input to inverter gate 130 is now HI and thus its output will be LOW. This will cause PFET Q16 to come ON and latch inverter gate 130 output in the LOW state. Because the output of inverter gate 130 is LOW, PFET comes ON. Since PFET Q10 is OFF, no current flows to ground from Vss through the PFET stack Q14 and Q10. Similarly, since NFET Q20 is also OFF, no current flows from Vss to ground through NFET Q20. PFET Q14 thus regulates the output of the digital logic circuit through the PFET stack. Accordingly, node N2 will be at ground potential with no DC current flowing in the entire circuit. (See Table II).

FIG. 5 Circuit Operation: Condition—RESET is LOW and INPUT AA is LOW:

INPUT AA must be valid before RESET is placed in the LOW state. Once RESET is placed in the LOW state, the circuit is in evaluation mode. Since INPUT AA is LOW, NFET Q21 is OFF. When RESET is removed, PFET Q10 comes ON (NFET Q12 goes OFF). PFET Q14, however, is still ON after RESET is removed due to the propagation delay inherent in the switching circuit 150's components. This will cause node N2 to be pulled to voltage Vss because PFET stack Q14 and Q10 is ON.

In switching circuit 150, the output of inverter gate 140 goes HI and causes NFET Q20 to come ON and PFET Q18 to go OFF. When NFET Q20 comes ON, node N3 remains at voltage Vss. Node N3 is HI and the output of inverter gate 130 stays LOW. PFET Q16 will stay ON and latch the output of inverter gate 130 LOW. Because the output of inverter gate 130 is LOW, PFET Q14 remains ON. Since PFET Q14 remains ON, the PFET stack (Q14 and Q10) will remain ON and maintain node N2 at Vss. Note that once again, because NFET's Q12 and Q21 are OFF, no DC current flows in the entire circuit.

FIG. 5 Circuit Operation: Condition-RESET is LOW and INPUT AA is HI:

INPUT AA must once again be valid before RESET is placed in the LOW state. Once RESET is placed in the LOW state, the circuit is once again in evaluation mode. Since INPUT AA is HI, NFET Q21 comes ON and node N2 stays at ground. When RESET is removed, PFET Q10 comes ON (NFET Q12 goes OFF). PFET Q14, however, is still ON after RESET is removed due to the propagation delay inherent in switching circuit 150's components. This will cause node N2 to be a "weak zero" since NFET Q21 is fighting PFET stack Q14 and Q10. As described supra, this condition causes DC current to be dissipated in the circuit which contributes to hot-electron effects and electromigration concerns.

In the switching circuit 150, the output of inverter gate 140 goes HI and causes NFET Q20 to come ON and PFET Q18 to go OFF. When NFET Q20 comes ON, node N3 is pulled to the same potential as node N2, i.e. a "weak zero." The "weak zero" at node N3 causes the output of inverter gate 130 to go HI and PFET Q16 will therefore go OFF. The switching circuit is now no longer latched. Because the output of inverter gate 130 is HI, PFET Q14 goes OFF. Since PFET Q14 is OFF, the PFET stack (Q14 and Q10) will be OFF and NFET Q21 will no longer be fighting the PFET stack. Node N2 is now pulled completely to ground and once again no DC current flows in the entire circuit. (See Table II).

Accordingly, because PFET Q14 is OFF when PFET Q10 is ON and NFET Q12 is OFF and NFET Q21 is ON, no current path exists from voltage Vss to ground in the entire circuit (recall, this was not the case in the circuit of FIG. 4). Therefore, the low-power pre-discharged ratioed logic circuit and method described by the present invention (1) substantially reduces and in some circumstances eliminates DC power consumption from digital logic circuits, (2) preserves the advantageous layout characteristics of standard digital circuits and (3) increases the reliability of such circuits by reducing hot-electron effects and electromigration concerns through reduction and elimination of DC power dissipation. Moreover, since DC current is eliminated, the "average" current in the circuit is reduced by more than an order of magnitude.

TABLE II

| Low Power Clocked Ratioed Single Input NOR Function | | |
| --- | --- | --- |
| RESET | INPUT AA | OUTPUT |
| 0 | 0 | 1 |
| 0 | 1 | 0 |
| 1 | X | 0 |

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, negative or reverse logic may be employed, or transistors such as JFET's (junction field effect transistor), BJT's (bipolar junction transistors), etc may be employed. Therefore, the invention in its broader aspects is not limited to the specific details, representative apparatus and method, and illustrative examples shown and described. Accordingly, departures may be made from such details without departing from the spirit or scope of the applicants' general inventive concept.

We claim:

1. A circuit for producing low power digital logic, the circuit comprising:
   (a) ratioed logic circuitry in circuit communication with a switching circuit, the ratioed logic circuitry comprising a signal input and a signal output and logic circuitry for performing digital logic functions;
   (b) the switching circuit having:
      (i) an output circuit switchable between first and second states, for regulating the ratioed logic circuitry signal output and thereby ratioed logic circuitry power consumption;
      (ii) a control circuit for switching the output circuit between the first state and the second state;
      (iii) a sensing circuit for sensing ratioed logic circuitry input signal conditions and for controlling the output circuit responsive to the states of the control circuit;

the control circuit in circuit communication with the sensing circuit, and the sensing circuit in circuit communication with the output circuit.

2. The switching circuit of claim 1 wherein the sensing circuit comprises a complementary follower circuit in circuit communication with the control circuit and the output circuit.

3. The switching circuit of claim 1 wherein the control circuit comprises an inverter circuit.

4. The switching circuit of claim 3 wherein the sensing circuit further comprises a latching circuit in communication with the inverter circuit.

5. The switching circuit of claim 4 where in the latching circuit comprises a transistor.

6. The switching circuit of claim 1 wherein the output circuit comprises a transistor.

7. The switching circuit of claim 2 wherein the complementary follower circuit comprises a P-channel MOSFET and an N-channel MOSFET.

8. A microprocessor having:
(a) ratioed logic circuitry in circuit communication with a switching circuit, the ratioed logic circuitry comprising a signal input and a signal output and logic circuitry for performing digital logic functions;
(b) the switching circuit having:
(i) an output circuit switchable between first and second states, for regulating the ratioed logic circuitry signal output and thereby digital logic circuitry power consumption;
(ii) a control circuit for switching the output circuit between the first state and the second state;
(iii) a sensing circuit for sensing ratioed logic circuitry input signal conditions and for controlling the output circuit responsive to the states of the control circuit;
the control circuit in circuit communication with the sensing circuit, and
the sensing circuit in circuit communication with the output circuit.

9. A switching circuit for reducing DC power consumption in ratioed logic circuits, the switching circuit comprising:
(a) an output circuit switchable between first and second states, for regulating a ratioed logic circuit signal output and thereby ratioed logic circuitry power consumption;
(b) a control circuit for switching the output circuit between the first state and the second state;
(c) a sensing circuit for sensing ratioed logic circuit input signal conditions and for controlling the output circuit responsive to the states of the control circuit;
the control circuit in circuit communication with the sensing circuit, and
the sensing circuit in circuit communication with the output circuit.

10. The switching circuit of claim 9 wherein the sensing circuit comprises a complementary follower circuit in circuit communication with the control circuit and the output circuit.

11. The switching circuit of claim 9 wherein the control circuit comprises an inverter circuit.

12. The switching circuit of claim 10 wherein the sensing circuit further comprises a latching circuit in communication with the inverter circuit.

13. The switching circuit of claim 12 where in the latching circuit comprises a transistor.

14. The switching circuit of claim 9 wherein the output circuit comprises a transistor.

15. A computer system having at least one microprocessor, the microprocessor comprising ratioed logic circuitry and switching circuitry for reducing DC power consumption, the switching circuitry comprising:
(a) an output circuit switchable between first and second states, for regulating ratioed logic circuitry output conditions and thereby the ratioed logic circuitry power consumption;
(b) a control circuit for switching the output circuit between the first state and the second state;
(c) a sensing circuit for sensing ratioed logic circuitry input conditions and for controlling the output circuit responsive to the states of the control circuit;
the control circuit in circuit communication with the sensing circuit,
the sensing circuit in circuit communication with the output circuit, and
the output circuit in circuit communication with the ratioed logic circuitry.

16. The switching circuit of claim 15 wherein the sensing circuit comprises a complementary follower circuit in circuit communication with the control circuit and the output circuit.

17. The switching circuit of claim 15 wherein the control circuit comprises an inverter circuit.

18. The switching circuit of claim 17 wherein the sensing circuit further comprises a latching circuit in communication with the inverter circuit.

19. A switching circuit for reducing DC power consumption in a digital logic circuit, comprising:
(a) a reset signal input having an inverter circuit and for changing the switching circuit between first and second states,
(b) a sensing circuit for sensing voltage level transitions of a digital logic circuit signal input and signal output node, the sensing circuit in circuit communication with the reset signal input and the digital logic circuit,
(c) a power source output switchable between first and second states and for controlling power supplied to the digital logic circuit, and responsive to the sensing circuit and the reset signal input, and
(d) a latching circuit for latching the power source output in the first state, the latching circuit responsive to the sensing circuit,
the reset signal input in circuit communication with the sensing circuit,
the sensing circuit in circuit communication with the latching circuit,
the power source output in circuit communication with the latching circuit and the digital logic circuit, and
whereby the power source output, responsive to the sensing circuit and the reset signal input, controls power supplied to the digital logic circuit by switching between first and second states, wherein the first state is an on state and the second state is an off state.

20. In a digital circuit which executes logic functions, the digital circuit including an input, output and a control circuit, and digital signals associated therewith, a method for reducing the DC power consumption of the digital circuit comprising the steps of:
(a) sensing voltage level transitions at an output node in the digital circuit through a sensing circuit;

(b) applying one of a plurality of preselected voltage levels to the output circuit, the step including the steps of changing a switching circuit from a first state to a second state as a function of the voltage level transitions and pre-discharging said output node;

(c) regulating DC current flow in the digital circuit responsive to the first and second states of the switching circuit to thereby determine the voltage level of the output circuit.

21. The method of claim 20 wherein the step of sensing voltage level transitions includes the step of sensing the output node for a weak zero condition.

22. The method of claim 20 further including the step of changing a weak zero output to a ground output.

23. In a computer system which executes logic functions, the computer system having digital logic circuitry, a method for reducing the DC power consumption of the computer system comprising the steps of:

(a) sensing voltage level transitions at an output node in the digital logic circuitry through a sensing circuit;

(b) applying one of a plurality of preselected voltage levels to an output circuit, the step including the step of changing a switching circuit from a first state to a second state as a function of the voltage level transitions;

(c) regulating DC current flow in the digital circuit responsive to the first and second states of the switching circuit to thereby determine the voltage level of the output circuit; and (d) changing a weak zero output to a ground output at the output circuit.

* * * * *